(12) United States Patent
Kim et al.

(10) Patent No.: US 11,040,837 B2
(45) Date of Patent: Jun. 22, 2021

(54) METHOD FOR MANUFACTURING DISPLAY DEVICE

(71) Applicant: SAMSUNG DISPLAY CO., LTD., Yongin-si (KR)

(72) Inventors: Kyung Sik Kim, Yongin-si (KR); Yong Lim Kim, Yongin-si (KR); Byung Min Shin, Yongin-si (KR); Seung Kuk Lee, Yongin-si (KR); Jae Shik Jung, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 147 days.

(21) Appl. No.: 16/520,664

(22) Filed: Jul. 24, 2019

(65) Prior Publication Data

US 2020/0189862 A1 Jun. 18, 2020

(30) Foreign Application Priority Data

Dec. 13, 2018 (KR) .................. 10-2018-0161161

(51) Int. Cl.
| | |
|---|---|
| *B65G 47/90* | (2006.01) |
| *H01L 21/67* | (2006.01) |
| *H01L 21/20* | (2006.01) |
| *H01L 21/66* | (2006.01) |
| *H01L 21/70* | (2006.01) |
| *H01L 23/544* | (2006.01) |
| *H01L 21/68* | (2006.01) |

(52) U.S. Cl.
CPC .............. *B65G 47/90* (2013.01); *H01L 21/20* (2013.01); *H01L 21/67144* (2013.01); *H01L 21/67259* (2013.01); *H01L 21/70* (2013.01); *H01L 22/20* (2013.01); *H01L 23/544* (2013.01); *H01L 21/68* (2013.01); *H01L 2924/00* (2013.01)

(58) Field of Classification Search
None
See application file for complete search history.

(56) References Cited

U.S. PATENT DOCUMENTS

| | | |
|---|---|---|
| 2018/0182713 A1 | 6/2018 | Shiba |
| 2018/0182944 A1 | 6/2018 | Miles et al. |

*Primary Examiner* — Ronald P Jarrett
(74) *Attorney, Agent, or Firm* — Cantor Colburn LLP (57) ABSTRACT

A method for manufacturing a display device includes providing an original substrate on a support member, where the original substrate includes a first cell and a second cell adjacent to each other in a row direction or a column direction, moving a first picker above the first cell, calculating a first corrected coordinate based on an initial position of the first picker and a reference position of the first cell, moving the first picker to a first corrected position by using the first corrected coordinate such that the first picker picks up the first cell, moving the first picker above the second cell, and moving the first picker to a second corrected position by using a second corrected coordinate such that the first picker picks up the second cell, where the second corrected coordinate is the same as the first corrected coordinate.

16 Claims, 9 Drawing Sheets

METHOD FOR MANUFACTURING DISPLAY DEVICE

CROSS-REFERENCE TO RELATED APPLICATION

This application claims priority to Korean Patent Application No. 10-2018-0161161, filed on Dec. 13, 2018, and all the benefits accruing therefrom under 35 U.S.C. § 119, the content of which in its entirety is herein incorporated by reference.

BACKGROUND OF THE INVENTION

(a) Field of the Invention

The invention relates to a method for manufacturing a display device.

(b) Description of the Prior Art

As the information age has become a reality, a field of display devices for visually displaying electrical information signals has been rapidly growing. Therefore, various display devices have been developed and sold. For example, there is a display device such as a liquid crystal display device ("LCD"), a field emission display device ("FED"), an electrophoretic display device ("EPD"), an electro-wetting display device ("EWD"), and an organic light emitting display device ("OLED"), a quantum dot display device ("QD"), and the like.

A display device includes a display panel in which a display element and a driving element are disposed. In a manufacturing process of the display device, a plurality of display panels may be formed on a single original substrate. Each of the plurality of display panels formed on the original substrate may be cut into a plurality of cells. The plurality of cells may be picked up by a picker such that they are transferred to the next process.

SUMMARY OF THE INVENTION

The invention has been made in an effort to provide a method for manufacturing a display device that is capable of reducing the time required to pick up a plurality of cells that are formed in an original substrate by using a correction coordinate of a picker picking up a specific cell as a correction coordinate of the picker picking up another cell adjacent to the specific cell.

Further, the invention has been made in an effort to provide a method for manufacturing a display device that is capable of reducing, by using pre-stored data for a difference between a correction coordinate of one picker picking up a specific cell and a correction coordinate of another picker picking up another cell to calculate a correction coordinate of the another picker, the time required to pick up a plurality of cell.

A method for manufacturing a display device according to an exemplary embodiment of the invention includes providing an original substrate on a support member, where the original substrate includes a first cell and a second cell adjacent to each other in a row direction or a column direction, moving a first picker above the first cell, calculating a first corrected coordinate based on an initial position of the first picker above the first cell and a reference position of the first cell, moving the first picker to a first corrected position by using the first corrected coordinate such that the first picker picks up the first cell at the first corrected position, moving the first picker above the second cell, and moving the first picker to a second corrected position by using a second corrected coordinate such that the first picker picks up the second cell at the second corrected position, where the second corrected coordinate is the same as the first corrected coordinate.

In an exemplary embodiment, the calculating the first corrected coordinate may include detecting a position of a first alignment mark on the first cell, and detecting the reference position of the first cell based on the position of the first alignment mark.

In an exemplary embodiment, the first alignment mark may be on a pad area in which a plurality of pads of the first cell is disposed.

In an exemplary embodiment, the calculating the first corrected coordinate may further include calculating the first corrected coordinate by subtracting the initial position of the first picker above the first cell from the reference position of the first cell.

In an exemplary embodiment, the first corrected position may be a sum of the initial position of the first picker above the first cell and the first corrected coordinate, and the second corrected position may be a sum of an initial position of the first picker moved above the second cell and the second corrected coordinate.

In an exemplary embodiment, the first corrected position may be the same as the reference position of the first cell.

In an exemplary embodiment, the second cell may include a pad area in which a plurality of pads is disposed and a display area adjacent to the pad area, and a difference between a reference position of the second cell and the second corrected position may be one-tenth or less of a distance from one side of the pad area adjacent to the display area to the other opposite side of the pad area separated from the display area.

In an exemplary embodiment, the method may further include moving a second picker above a third cell adjacent to the second cell, where the second picker is different from the first picker, calculating a third corrected coordinate based on an initial position of the second picker above the third cell and a reference position of the third cell, moving the second picker to a third corrected position by using the third corrected coordinate such that the second picker picks up the third cell at the third corrected position, moving the second picker above a fourth cell that is adjacent to the third cell, and moving the second picker to a fourth corrected position by using a fourth corrected coordinate such that the second picker picks up the fourth cell at the fourth corrected position, where the fourth corrected coordinate is the same as the third corrected coordinate.

In an exemplary embodiment, the moving the second picker above the third cell and the moving the first picker above the first cell may be simultaneously performed, the calculating the first corrected coordinate and the calculating the third corrected coordinate may be simultaneously performed, the moving the first picker such that the first picker picks up the first cell and the moving the second picker such that the second picker picks up the third cell may be simultaneously performed, the moving the first picker above the second cell and the moving the second picker above the fourth cell may be simultaneously performed, and the moving the first picker such that the first picker picks up the second cell and the moving the second picker such that the second picker picks up the fourth cell may be simultaneously performed.

In an exemplary embodiment, the first picker and the second picker may be connected to a same robot arm.

In an exemplary embodiment, the method may further include moving a second picker above a third cell adjacent to the second cell, where the second picker is different from the first picker, calculating a third corrected coordinate by using corrected coordinate data for the first cell and the third cell, and moving the second picker to a third corrected position by using the third corrected coordinate such that the second picker picks up the third cell at the third corrected position.

In an exemplary embodiment, the corrected coordinate data may include a plurality of first stored corrected coordinates for a difference between a position of the first picker above the first cell and the reference position of the first cell, and a plurality of third stored corrected coordinates for a difference between a position of the second picker above the third cell and a reference position of the third cell.

In an exemplary embodiment, the calculating the third corrected coordinate may include calculating a plurality of difference coordinates by subtracting each of the plurality of first stored corrected coordinates from each of the plurality of third stored corrected coordinates, and adding a representative difference coordinate and the first corrected coordinate, where the representative difference coordinate is an average value or a median value of the plurality of difference coordinates.

In an exemplary embodiment, a pad area of the first cell and a pad area of the second cell may be disposed adjacent to each other while having a border between the first cell and the second cell.

In an exemplary embodiment, before the providing the original substrate on the support member, the method may further include cutting a plurality of cells included in the original substrate.

In an exemplary embodiment, the method may further include after picking up the first cell, removing a protection film of the first cell by using a pin, where the protection film of the first cell is disposed on a top of a pad area of the first cell, and after picking up the second cell, removing a protection film of the second cell by using the pin, where the protection film of the second cell is disposed on a top of a pad area of the second cell.

According to the invention, the time required to manufacture the display device can be reduced.

The effects achieved by the invention are not limited by the contents illustrated above, and more various effects are included in the specification.

DETAILED DESCRIPTION

The advantages and features of the invention and the manner of achieving them will become apparent with reference to the exemplary embodiments described in detail below with reference to the accompanying drawings. However, the invention may be embodied in many different ways and should not be construed as being limited to the exemplary embodiments set forth herein, these exemplary embodiments are rather provided so that this disclosure will be thorough and complete and will fully convey the concept of the invention to those skilled in the art, and the invention is only defined by the scope of the appended claims.

The shapes, sizes, ratios, angles, numbers, and the like disclosed in the drawings for describing the exemplary embodiments of the invention are illustrative, so the invention is not limited thereto. Like reference numerals refer to like elements throughout the specification. When describing the invention, if it is determined that a detailed description of related well-known techniques would obscure the subject matter of the invention, the detailed description of them will be omitted. When the terms "comprises", "having", "consisting of", etc. are used in this specification, other portions may be added unless "only" is used. Unless the context specifically dictates otherwise, words in the singular form include the plural.

When interpreting the elements, it is to be understood that an error range is included even if there is no description.

When describing the positional relationship between two elements, if an element is referred to as being "on", "over", "under", and "next to" another element, intervening elements may also be present unless the word "right" or "directly" is used.

When an element or a layer is referred to as being "on" another element or layer, it can be directly on the other element or intervening elements may also be present.

Terms such as "first", "second", and the like are used to explain a variety of different elements, but these elements are not limited by these terms. These terms are only used to distinguish one element from another. Therefore, the first element described below may be the second component within the technical spirit of the invention.

Like reference numerals refer to like elements throughout the specification.

The size and thickness of each element shown in the drawings are arbitrarily shown for convenience of explanation, so the exemplary embodiments are not necessarily limited to those shown in the drawings.

It is to be understood that each of the features of the various exemplary embodiments of the invention may be partially or entirely combined or combined with each other, and technically cooperate or work together as will be appreciated by those skilled in the art. The exemplary embodiments may be realized independently with respect to each other, and may be realized in conjunction with each other.

The preferred exemplary embodiments of the invention will now be described in detail with reference to accompanying drawings.

Figure 1:
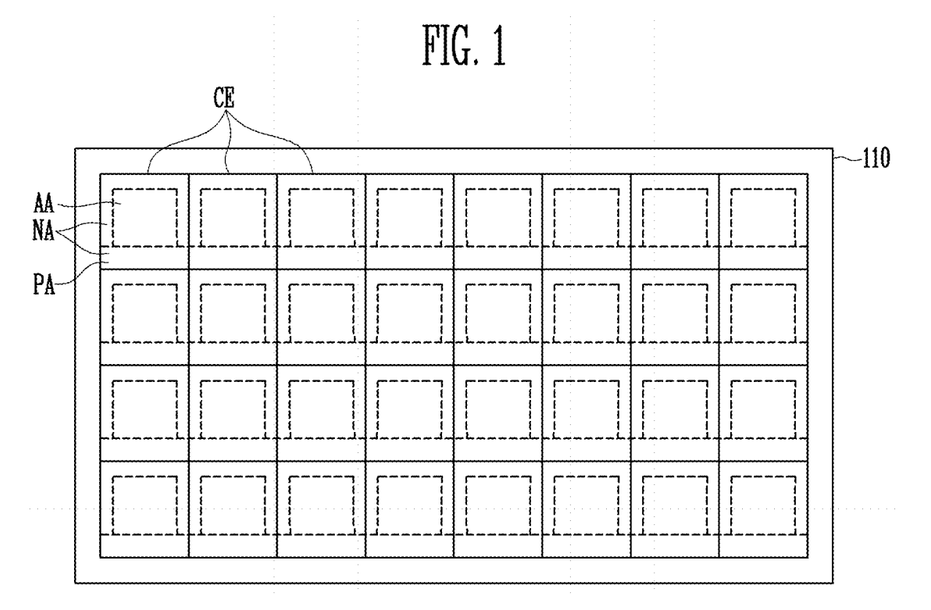
FIG. 1 is a top plan view for illustrating an exemplary embodiment of a method for manufacturing a display device according to the invention.

FIG. 1 is a top plan view for illustrating an exemplary embodiment of a method for manufacturing a display device according to the invention.

Referring to FIG. 1, a plurality of cells CE may be formed on an original substrate 110. Specifically, the original substrate 110 is a mother substrate of a size in which the plurality of cells CE may be formed. In an exemplary embodiment, the original substrate 110 may be made of glass, or a plastic material having flexibility, for example, a plastic material such as polyimide. However, the invention is not limited thereto.

In a manufacturing process of the display device, a plurality of display panels may be formed on the original substrate 110 so as to save the time required for the process. The plurality of display panels may be formed on the original substrate 110 in a plurality of rows and a plurality of columns. The original substrate 110 may be cut into a plurality of cells CE such that the plurality of cells CE respectively corresponds to the plurality of display panels. Therefore, each of the plurality of cells CE may form the display panel. The original substrate 110 may be cut into the plurality of cells CE by a laser process, but the invention is not limited thereto. In an exemplary embodiment, for example, it may also be cut by a scribing process.

Each of the plurality of cells CE includes a display area AA and a non-display area NA. The display area AA may be an area where an image of the display device is displayed. A plurality of pixels which are minimum units for emitting light may be defined in the display area AA. Each pixel may be one of red, green, and blue color pixels.

A display element and a driving element for driving the display element may be disposed in each pixel. The driving element may be implemented as a thin film transistor, and the thin film transistor may be connected to signal lines (i.e., a gate line and a data line).

Specifically, although not shown in FIG. 1, a plurality of signal lines may be disposed in the display area AA. The plurality of signal lines may include a plurality of data lines and a plurality of gate lines. The data line may extend in a first direction to transmit a data signal to the thin film transistor, and the gate line may extend in a second direction perpendicular to the first direction to transmit a gate signal to the thin film transistor. The first direction and the second direction may be perpendicular to each other, but the invention is not limited thereto.

The non-display area NA is an area where no image is displayed, and may be provided at at least one side of the display area AA. For example, the non-display area NA may surround the display area AA. Lines or a circuit portion for driving the plurality of pixels may be formed in the non-display area NA. For example, a data driver and a gate driver may be disposed in the non-display area NA. The data driver may be a component that processes data for displaying an image and a driving signal. The gate driver may be a component that outputs the gate signal under the control of a timing controller and that sequentially supplies the gate signal to the plurality of pixels. The data driver and the gate driver may be disposed in a scheme such as a chip on glass ("COG") scheme, a chip on film ("COF") scheme, a tape carrier package ("TCP") scheme, or the like depending on how they are mounted. However, the invention is not limited thereto. In another exemplary embodiment, the data driver and the gate driver may be disposed in another scheme.

The non-display area NA includes a pad area PA. The pad area PA is an area in which a plurality of pads is formed. The plurality of pads connects lines in the display area AA to an external module such as COF (not shown). The COF may include a flexible base film and a driving IC, and may supply a signal to the plurality of pixels in the display area AA. The COF may be connected to the pad area PA to supply a power supply voltage, a data voltage, or the like to the plurality of pixels in the display area AA through the plurality of pads. The pad area PA extends from one side of the display area AA.

Figure 2:
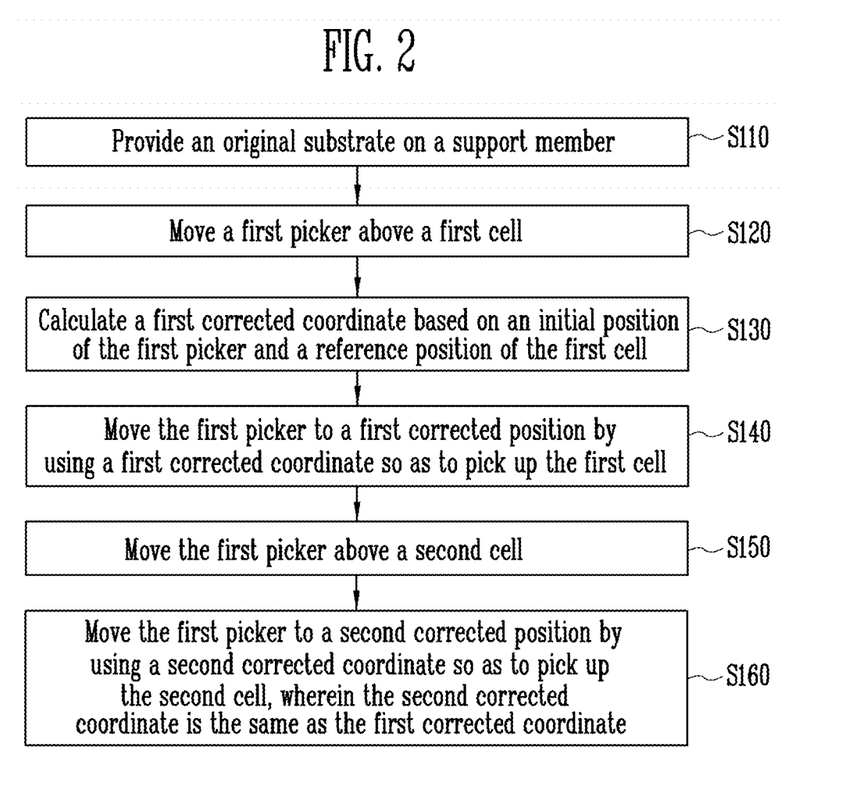
FIG. 2 is a flowchart of an exemplary embodiment of a method for manufacturing a display device according to the invention.

FIG. 2 is a flowchart of an exemplary embodiment of a method for manufacturing a display device according to the invention. FIGS. 3A to 3D are top plan views for illustrating an exemplary embodiment of a method for manufacturing a display device according to the invention. In FIGS. 3A to 3D, only a first cell CE1 and a second cell CE2 of a plurality of cells CE are shown, as an example. For ease of description, the following description will be made with reference to FIG. 1.

Figure 3A:
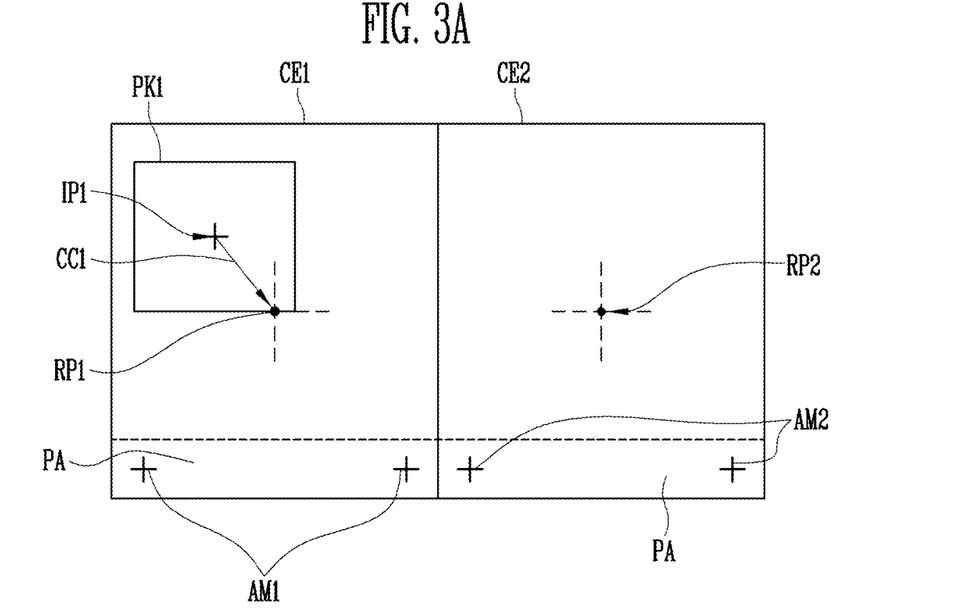
FIGS. 3A to 3D are top plan views for illustrating an exemplary embodiment of a method for manufacturing a display device according to the invention.

First, a plurality of display panels may be formed in an original substrate 110. In a manufacturing process of the display device, the plurality of display panels may be formed in the original substrate 110 in a plurality of rows and a plurality of columns so as to save the time required for the process.

Next, the plurality of display panels formed in the original substrate 110 may be cut into a plurality of cells CE, each of which corresponds to the display panels. The original substrate 110 may be cut into a plurality of cells CE by a laser process or a scribing process, but the invention is not limited thereto. In another exemplary embodiment, the original substrate 110 may be cut into a plurality of cells CE by another process.

Next, referring to FIG. 2 and FIG. 3A, the original substrate 110 including the plurality of cells CE is provided on a support member (not shown) (S110). The support member supports various components of the display device during a manufacturing process of the display device.

The plurality of cells CE includes a first cell CE1 and a second cell CE2. The plurality of cells CE may include a plurality of rows and a plurality of columns. The first cell CE1 may be one of the plurality of cells CE that are arranged in odd-numbered columns. The second cell CE2 may be one of the plurality of cells CE that are arranged in even numbered columns, and may be arranged in parallel with the first cell CE1 in the same row. Accordingly, a pad area PA of the first cell CE1 and a pad area PA of the second cell CE2 may be disposed adjacent to each other while having a border between the first cell CE1 and the second cell CE2.

Next, a first picker PK1 moves above the first cell CE1 (S120) in the top plan view. The first picker PK1 is configured to pick up each of the plurality of cells CE and move it to the next step. The first picker PK1 may move above the first cell CE1 and stop above the first cell CE1

Next, a first corrected coordinate CC1 is calculated based on a first initial position IP1 of the first picker PK1 and a reference position RP1 of the first cell CE1 (S130).

Specifically, the first initial position IP1 of the first picker PK1 may be detected. The first initial position IP1 is a position where the first picker PK1 stops above the first cell CE1. The first initial position IP1 may overlap the first cell CE1.

Next, the reference position RP1 of the first cell CE1 may be detected by using a first alignment mark AM1 on the first cell CE1. An alignment mark is a mark on each of the plurality of cells CE for detecting the reference position of the each of the plurality of cells CE. For example, the first alignment mark AM1 may be provided on a top surface of the first cell CE1 such that the reference position RP1 of the first cell CE1 is detected. The first alignment mark AM1 may be provided to a non-display area NA. For example, the first alignment mark AM1 may be provided to the pad area PA of the first cell CE1. Second, third, and fourth alignment marks AM2, AM3 and AM4 may be provided to the pad areas PA of second, third and fourth cell CE2, CE3 and CE4, respectively. (See FIG. 6A) A plurality of pads (not shown) may be disposed in the pad area PA of the first cell CE1, and the first alignment mark AM1 may be disposed on somewhere of the pad area PA in which the plurality of pads is not disposed. For example, there may be two first alignment marks AM1 as shown in FIG. 3A, and they may be disposed adjacent to two vertexes of the first cell CE1 in the pad area PA of the first cell CE1. However, exemplary embodiments of the first alignment mark AM1 according to the invention is not limited thereto, and it may be disposed to correspond to each of four vertexes of the first cell CE1 in the non-display area NA of the first cell CE1. The first alignment mark AM1 on the first cell CE1 may be detected by a scan camera that is included in the first picker PK1. The first picker PK1 may include the scan camera that can detect an image on a top surface of the first cell CE1. The scan camera of the first picker PK1 may detect a position of the first alignment mark AM1 on the first cell CE1.

Next, the reference position RP1 of the first cell CE1 may be detected based on the position of the first alignment mark AM1. The reference position RP1 of the first cell CE1 is a position that is used by the first cell CE1 as a reference. For example, the reference position RP1 of the first cell CE1 may be a center of the first cell CE1. The reference position RP1 of the first cell CE1 may be calculated based on the position of the first alignment mark AM1 that is detected by the scan camera. When the first alignment marks AM1 correspond to four vertices of the first cell CE1 in the non-display area NA of the first cell CE1, the reference position RP1 of the first cell CE1 may be an intersection of two diagonal lines each of which connects the two first alignment marks AM1 facing each other diagonally.

Next, the first corrected coordinate CC1 may be calculated based on the reference position RP1 of the first cell CE1 and the first initial position IP1 of the first picker PK1. The first corrected coordinate CC1 may be a vector that moves the first picker PK1 from the first initial position IP1 to the reference position RP1 of the first cell CE1. As shown in FIG. 3A, the first corrected coordinate CC1 may be a vector whose start point is the first initial position IP1 and whose end point is the reference position RP1 of the first cell CE1. Accordingly, the first corrected coordinate CC1 may be calculated by subtracting the first initial position IP1 from the reference position RP1 of the first cell CE1. For example, the first corrected coordinate CC1 may be (x1, y1). That is, the first picker PK1 may be moved by x1 along a horizontal axis and by y1 along a vertical axis from the first initial position IP1, thereby moving to the reference position RP1 of the first cell CE1.

Figure 3B:
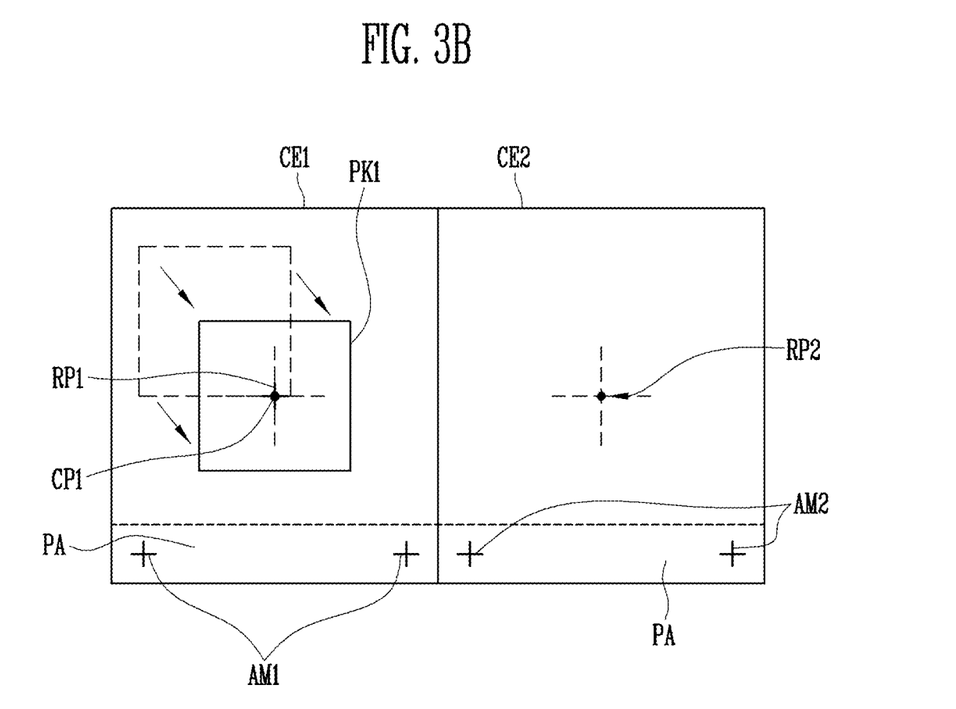

Next, referring to FIG. 3B, the first picker PK1 moves to a first corrected position CP1 by using the first corrected coordinate CC1 such that it picks up the first cell CE1 at the first corrected position CP1 (S140). The first corrected position CP1 is a final position of the first picker PK1 that is moved by the first corrected coordinate CC1 from the first initial position IP1. The first corrected position CP1 may be calculated by adding the first initial position IP1 and the first corrected coordinate CC1. The first corrected position CP1 may be the same as the reference position RP1 of the first cell CE1. For example, the first corrected coordinate CC1 may be (x1, y1). In this case, the first corrected position CP1 may be a position that is moved by x1 along the horizontal axis and by y1 along the vertical axis from the first initial position IP1. The first picker PK1 may be moved to the first corrected position CP1.

Next, the first picker PK1 may pick up and move the first cell CE1. The first picker PK1 may be lowered to contact the first cell CE1 at the first corrected position CP1, and may absorb the first cell CE1 to separate it from the original substrate 110. The first picker PK1 may move the first cell CE1 to the next step of the manufacturing process of the display device.

Next, the first picker PK1 may pick up and move another cell CE that is arranged in the same column as that of the first cell CE1. For example, when the first cell CE1 is a cell CE of the plurality of cells CE arranged in the first row and the first column, the first picker PK1 may pick up and move the first cell CE1, and then pick up and move a cell CE that is arranged in the second row and the first column. Then, the first picker PK1 may pick up and move a cell CE that is arranged in the third row and the first column. As described above, the first picker PK1 may sequentially pick up the cells CE that are arranged in the same column as that of the first cell CE1 by increasing the row number, and move them to the next step of the process. Therefore, the first picker PK1 may move all of the cells CE that are arranged in the same column as that of the first cell CE1. The manner in which the first picker PK1 picks up and moves all of the cells CE arranged in the same column as that of the first cell CE1 is the same as the foregoing steps S110 to S140 of moving the first cell CE1. However, the invention is not limited thereto.

Figure 3C:
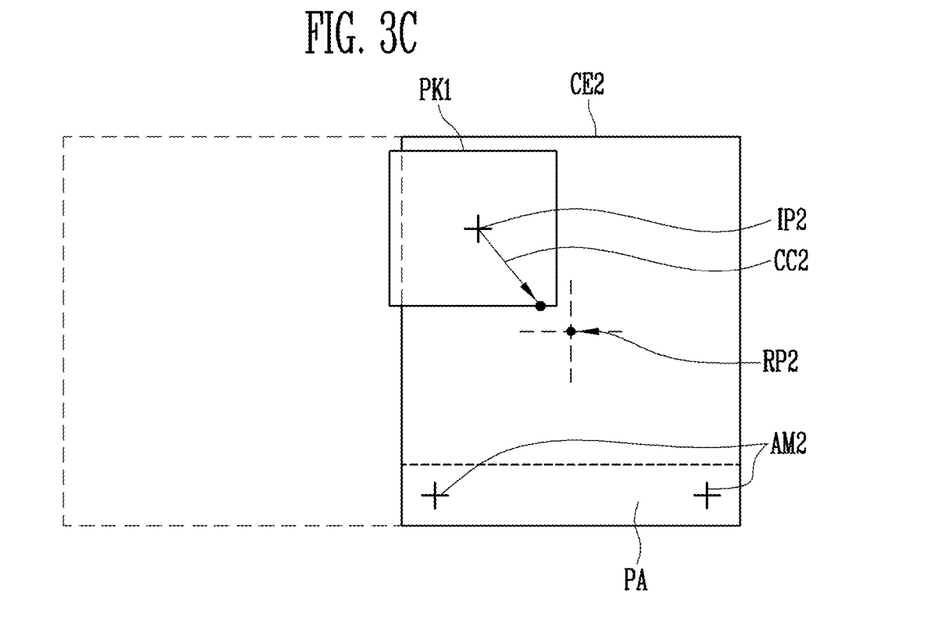

Referring to FIG. 3C, the first picker PK1 moves above the second cell CE2 that is adjacent to the first cell CE1 (S150). The first picker PK1 may move above the second cell CE2 and stop at a second initial position IP2 on the second cell CE2. The second initial position IP2 is a position where the first picker PK1 stops above the second cell CE2. The second initial position IP2 may overlap the second cell CE2 in the top plan view.

Figure 3D:
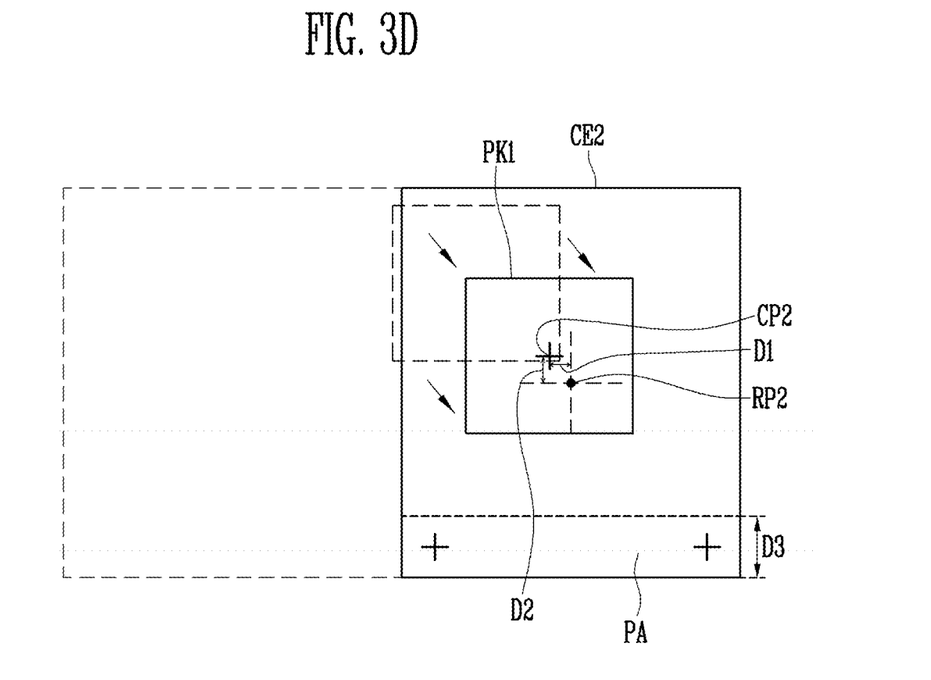

Next, referring to FIG. 3D, the first picker PK1 moves to a second corrected position CP2 by using a second corrected coordinate CC2, which is the same as the first corrected coordinate CC1, to pick up the second cell CE2 (S160). The second corrected coordinate CC2 may be a vector that moves the first picker PK1 from the second initial position IP2 to the second corrected position CP2. The second corrected coordinate CC2 may be the same as the first corrected coordinate CC1. That is, the first picker PK1 may use the pre-calculated first corrected coordinate CC1 as the second corrected coordinate CC2. For example, in the case that the first corrected coordinate CC1 is (x1, y1), the second corrected coordinate CC2 may also be (x1, y1).

The second corrected position CP2 may be a final position of the first picker PK1 that is moved by the second corrected coordinate CC2 from the second initial position IP2. The second corrected position CP2 may be calculated by adding the second corrected coordinate CC2 to the second initial position IP2. For example, the second corrected coordinate CC2 may be (x1, y1), which is the same as the first corrected coordinate CC1. In this case, the second corrected position CP2 may be a position that is moved by x1 along the horizontal axis and moved by y1 along the vertical axis from the second initial position IP2. The first picker PK1 may be moved from the second initial position IP2 to the second corrected position CP2.

Next, the first picker PK1 may pick up and move the second cell CE2. The first picker PK1 may be lowered to contact the second cell CE2 at the second corrected position CP2, and may absorb the second cell CE2 to separate it from the original substrate 110 and the other cells CE. The first picker PK1 may move the second cell CE2 to the next step of the manufacturing process of the display device.

Next, the first picker PK1 may pick up and move another cell CE that is arranged in the same column as that of the second cell CE2. For example, if the second cell CE2 is a cell CE of the plurality of cells CE arranged in the first row and the second column, the first picker PK1 may pick up and move the second cell CE2, and then pick up and move a cell CE that is arranged in the second row and the second column. Then, the first picker PK1 may pick up and move a cell CE that is arranged in the third row and the second column. As described above, the first picker PK1 may sequentially pick up the cells CE that are arranged in the same column as that of the second cell CE2 by increasing the row number, and move them to the next step of the process. Therefore, the first picker PK1 may sequentially move all of the cells CE that are arranged in the same column as that of the second cell CE2. The manner in which the first picker PK1 picks up and moves all of the cells CE arranged in the same column as that of the second cell CE2 may be the same as the foregoing steps S150 and S160 of moving the second cell CE2. However, the invention is not limited thereto.

Referring to FIG. 3D, a difference between the second corrected position CP2 and a reference position RP2 of the second cell CE2 may be one-tenth of the thickness of the pad area PA of the second cell CE2 or less. The difference between the second corrected position CP2 and the reference position RP2 of the second cell CE2 may be a distance D1 between the second corrected position CP2 and the reference position RP2 of the second cell CE2 along the horizontal axis and a distance D2 between the second corrected position CP2 and the reference position RP2 of the second cell CE2 along the vertical axis. The distance D1 along the horizontal axis may be a difference between a horizontal axis coordinate of the second corrected position CP2 and a horizontal axis coordinate of the reference position RP2 of the second cell CE2. The distance D2 along the vertical axis may be a difference between a vertical axis coordinate of the second corrected position CP2 and a vertical axis coordinate of the reference position RP2 of the second cell CE2. The pad area PA of the second cell CE2 may include one side adjacent to the display area AA of the second cell CE2 and the other opposite side separated from the display area AA. The thickness of the pad area PA of the second cell CE2 may be a distance D3 from the one side to the other opposite side of the pad area PA. The distances D1 and D2 between the second corrected position CP2 and the reference position RP2 of the second cell CE2 along the horizontal and vertical axes may be one tenth of the distance D3 of the pad area PA of the second cell CE2 or less, respectively.

In an exemplary embodiment, for example, the first corrected coordinate CC1 may be (1.93 millimeters (mm), −2.64 mm). A difference between the second initial position IP2 and the reference position RP2 of the second cell CE2 may be (1.88 mm, −2.89 mm). The distance D3 of the pad area PA may be 3 mm. In the case that the second corrected coordinate CC2 is the same as the first corrected coordinate CC1, which is (1.93 mm, −2.64 mm), the distance D1 between the second corrected position CP2 and the reference position RP2 of the second cell CE2 along the horizontal axis may be 0.05 mm, which may be equal to or smaller than 0.3 mm that is one tenth of the distance D3 of the pad area PA. The distance D2 between the second corrected position CP2 and the reference position RP2 of the second cell CE2 along the vertical axis may be 0.25 mm, which may be equal to or smaller than 0.3 mm that is one tenth of the distance D3 of the pad area PA.

Each of the plurality of cells CE may be picked up by the picker to be provided to a turn-table. A protective film for protecting the components disposed therebelow may be attached to a top surface of the pad area PA of the plurality of cells CE. The protective film which is attached to the pad area PA of the cell CE provided to the turn-table may be removed by a pin. The pin may be lowered to the pad area PA of the cell CE to contact the protective film, and may move in a direction where the pad area PA extends. The protective film in contact with the pin may be caught by the pin and removed from the pad area PA as the pin moves.

For the first cell CE1, the first corrected coordinate CC1 may be calculated based on the first initial position IP1 of the first picker PK1 and the reference position RP1 of the first cell CE1. The first corrected position CP1 may be calculated by adding the first corrected coordinate CC1 to the first initial position IP1. Therefore, the first corrected position CP1 may be the same as the reference position RP1 of the first cell CE1. The first picker PK1 may move to the first corrected position CP1, thereby picking up the first cell CE1 and moving it to the turn-table. Accordingly, the pin may be properly lowered to the pad area PA of the first cell CE1.

For the second cell CE2, the second corrected coordinate CC2 is not calculated based on the reference position RP2 of the second cell CE2 and the second initial position IP2, and may be the same as the first corrected coordinate CC1. If each of the distance D1 between the second corrected position CP2 and the reference position RP2 of the second cell CE2 along the horizontal axis and the distance D2 therebetween (i.e., between the second corrected position CP2 and the reference position RP2 of the second cell CE2) along the vertical axis is greater than one tenth of the distance D3 of the pad area PA, the pin may be lowered to other areas except for the pad area PA of the second cell CE2. In this case, the pin cannot remove the protective film that is disposed in the pad area PA of the second cell CE2. The pin may be lowered to the other areas except for the pad area PA of the second cell CE2, for example, the display area AA, thereby damaging the display area AA. Accordingly, in the manufacturing method of the display device according to the current exemplary embodiment of the invention, each of the distance D1 between the second corrected position CP2 and the reference position RP2 of the second cell CE2 along the horizontal axis and the distance D2 therebetween along the vertical axis may be one tenth of the distance D3 of the pad area PA or less, such that the pin can effectively remove the protection film of the pad area PA of the second cell CE2. In addition, the display area AA of the display device may be prevented from being damaged by the pin.

In the manufacturing method of the display device in the prior art, when two adjacent cells are sequentially picked up by the same picker, both of corrected coordinates of two cells are separately calculated. For example, when a first picker picks up a first cell, a first corrected coordinate of the first cell is calculated. When the first picker picks up a second cell, since a second corrected coordinate of the second cell is not the same as the first corrected coordinate, the first corrected coordinate cannot be used as the second corrected coordinate. The second correction coordinate is calculated in the same way as that the first corrected coordinate is calculated. Therefore, it requires time to calculate the second corrected coordinate.

In contrast, according to the method for manufacturing a display device according to the current exemplary embodiment of the invention, in the case that two adjacent cells CE are sequentially picked up by the same picker, the corrected coordinate of one cell CE may be used as the corrected coordinate of another cell CE that is adjacent to the one cell CE in a row direction. For example, the first corrected coordinate CC1 used when the first picker PK1 picks up the first cell CE1 may be used as the second corrected coordinate CC2 used when the first picker PK1 picks up the second cell CE2. Therefore, when picking up and moving the second cell CE2, the second corrected coordinate CC2 may not be calculated based on the second initial position IP2 of the first picker PK1 and the reference position RP2 of the second cell CE2. Rather, the second corrected coordinate CC2 may be the same coordinate as the pre-calculated first corrected coordinate CC1. Therefore, it may not require time spent to calculate the second corrected coordinate CC2 of the second cell CE2 when picking up and moving the second cell CE2. Accordingly, the time required to calculate the corrected coordinates of each of the plurality of cells CE when picking up the plurality of cells CE that are disposed on the original substrate 110 may be reduced.

FIGS. 4A to 4D are cross-sectional views of another exemplary embodiment of a method for manufacturing a display device according to the invention. A first picker PK1 in FIGS. 4A to 4D is substantially the same as the first picker PK1 in FIGS. 1 to 3D, so a repeated description will be omitted. In FIGS. 4A to 4D, only first to fourth cells CE1 to CE4 of a plurality of cells CE are shown for convenience of explanation.

Figure 4A:
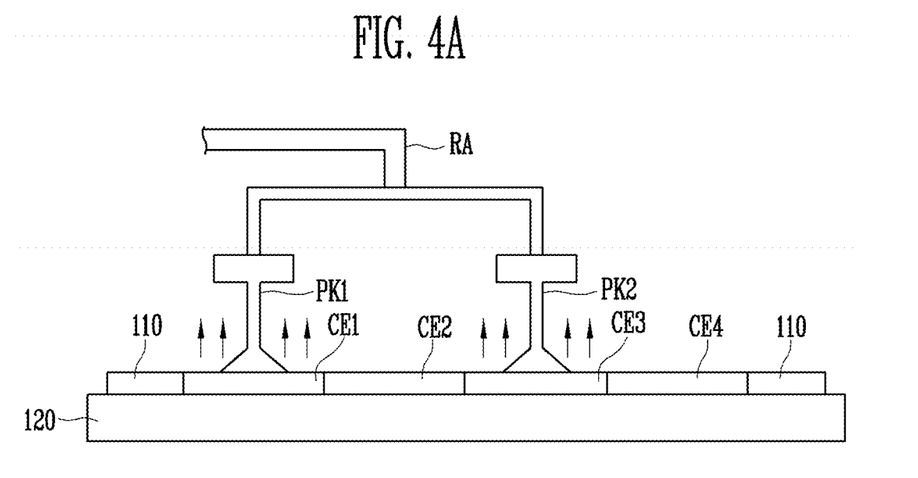
FIGS. 4A to 4D are cross-sectional views of another exemplary embodiment of a method for manufacturing a display device according to the invention.

First, a plurality of display panels may be formed in an original substrate 110 in a plurality of rows and a plurality of columns.

Next, the plurality of display panels formed in the original substrate 110 may be cut into a plurality of cells CE such that they respectively correspond to the display panels. The original substrate 110 may be cut into the plurality of cells CE by a laser process or a scribing process, but the invention is not limited thereto.

Next, referring to FIG. 4A, the original substrate 110 including the plurality of cells CE is provided on a support member 120. The plurality of cells CE includes a first cell CE1, a second cell CE2, a third cell CE3, and a fourth cell CE4. The first to fourth cells CE1 to CE4 may be sequentially arranged in the same row. For example, the first to fourth cells CE1 to CE4 may be arranged in the first row and the first column, the first row and the second column, the first row and the third column, and the first row and the fourth column, respectively. A pad area PA of the first cell CE1, a pad area PA of the second cell CE2, a pad area PA of the third cell CE3, and a pad area PA of the fourth cell CE4 may be disposed adjacent to each other while having borders therebetween.

A method for manufacturing a display device according to another exemplary embodiment of the invention will now be described. First, a first picker PK1 moves above the first cell CE1, and a second picker PK2 moves above the third cell CE3. The step of moving the first picker PK1 above the first cell CE1 and the step of the second picker PK2 moving above the third cell CE3 may be simultaneously performed. The second picker PK2 which is different from the first picker PK1 may be connected to the same robot arm RA as the first picker PK1. Therefore, a distance between the first picker PK1 and the second picker PK2 may be fixed. The distance between the first picker PK1 and the second picker PK2 may be similar to a distance between the first cell CE1 and the third cell CE3. Therefore, the first picker PK1 and the second picker PK2 may simultaneously move above the first cell CE1 and the third cell CE3, respectively. The first picker PK1 and the second picker PK2 may move above the first cell CE1 and the third cell CE3 and stop, simultaneously and respectively.

Next, a first corrected coordinate CC1 is calculated based on a first initial position IP1 of the first picker PK1 and a reference position RP1 of the first cell CE1. A third correction coordinate CC3 is calculated based on a third initial position IP3 of the second picker PK2 and a reference position RP3 of the third cell CE3. (Refer to FIG. 6A) The step of calculating the first corrected coordinate CC1 and the step of calculating the third correction coordinate CC3 may be simultaneously performed. The manner in which the first corrected coordinate CC1 is calculated may be the same as that described in FIGS. 1 to 3D.

The manner in which the third corrected coordinate CC3 is calculated may be the same as the manner in which the first corrected coordinate CC1 is calculated. That is, the third initial position IP3 at which the second picker PK2 stops above the third cell CE3 may be detected. Next, a position of a third alignment mark AM3 on the third cell CE3 may be detected by a scan camera that is included in the second picker PK2. Next, the reference position RP3 of the third cell CE3 may be detected based on the position of the third alignment mark AM3. Next, the third corrected coordinate CC3 may be calculated based on the reference position RP3 of the third cell CE3 and the third initial position IP3 of the second picker PK2. The third correction coordinate CC3 may be calculated by subtracting the third initial position IP3 from the reference position RP3 of the third cell CE3.

Next, the first picker PK1 moves to a first corrected position CP1 by using the first corrected coordinate CC1, and picks up the first cell CE1. The second picker PK2 moves to a third corrected position CP3 by using the third correction coordinate CC3, and picks up the third cell CE3. The step of the first picker PK1 moving to the first corrected position CP1 and picking up the first cell CE1 and the step of the second picker PK2 moving to the third corrected position CP3 and picking up the third cell CE3 may be simultaneously performed. The step of the first picker PK1 moving to the first corrected position CP1 and picking up the first cell CE1 may be the same as that described in FIGS. 1 to 3D.

The manner in which the second picker PK2 moves to the third corrected position CP3 and picks up the third cell CE3 may be the same as the manner in which the first picker PK1 moves to the first corrected position CP1 and picks up the first cell CE1. That is, the third corrected position CP3 may be calculated by adding the third initial position IP3 and the third correction coordinate CC3. The third corrected position CP3 may be the same as the reference position RP3 of the third cell CE3. The second picker PK2 may move to the third corrected position CP3, and may be lowered to the third cell CE3 so as to adsorb the third cell CE3.

Figure 4B:
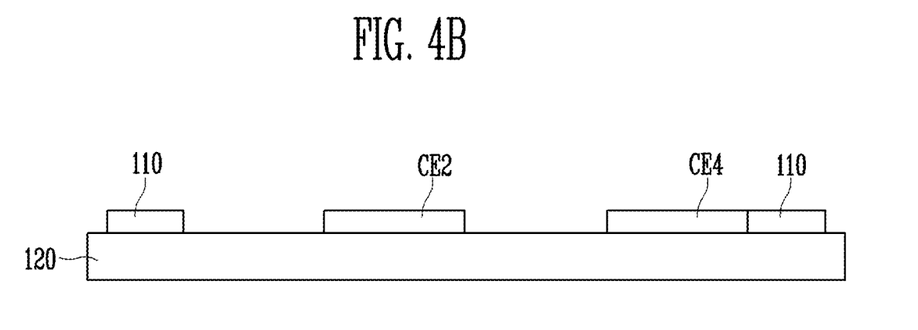

Next, referring to FIGS. 4A and 4B, the first picker PK1 and the second picker PK2 may simultaneously move the first cell CE1 and the third cell CE3 to the next step of the manufacturing process of the display device, respectively. The first picker PK1 may be lowered to contact the first cell CE1 at the first corrected position CP1, and absorb the first cell CE1 to separate it from the original substrate 110. The second picker PK2 may be lowered to contact the third cell CE3 at the third corrected position CP3, and absorb the third cell CE3 to separate it from the original substrate 110. In addition, the first picker PK1 and the second picker PK2 may move the first cell CE1 and the third cell CE3 to the next step of the manufacturing process of the display device, respectively.

Next, the first picker PK1 may pick up and move another cell CE that is arranged in the same column as that of the first cell CE1. The second picker PK2 may pick up and move another cell CE that is arranged in the same column as that of the third cell CE3. For example, in the case that the first cell CE1 is a cell CE of the plurality of cells CE that is arranged in the first row and the first column, and the third cell CE3 is a cell CE of the plurality of cells CE that is arranged in the first row and the third column, the first picker PK1 may sequentially pick up a cell CE arranged in the second row and the first column and a cell CE arranged in the third row and the first column, and move them to the next process. On the other hand, the second picker PK2 may sequentially pick up a cell CE arranged in the second row and the third column and a cell CE arranged in the third row and the third column, and move them to the next process. The first picker PK1 and the second picker PK2 may simultaneously pick up the cells CE that are arranged in the same row, and move them to the next process. The first picker PK1 and the second picker PK2 may sequentially pick up all of the cells CE, which are arranged in the same column as that of the first cell CE1 and the third cell CE3, respectively, by increasing the row number, and move them to the next process. However, the invention is not limited thereto.

Figure 4C:
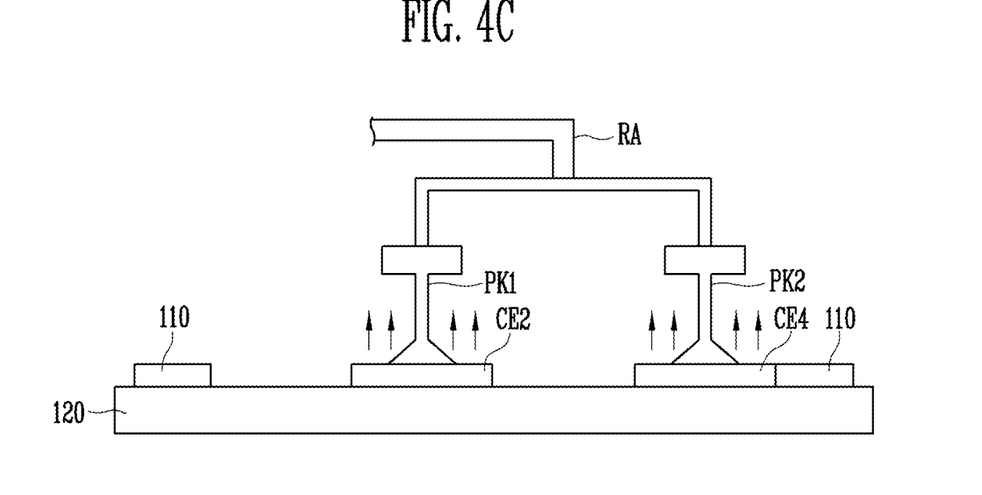

Next, referring to FIG. 4C, the first picker PK1 moves above the second cell CE2, and the second picker PK2 moves above the fourth cell CE4. The first picker PK1 may move to a second initial position IP2 above the second cell CE2, and the second picker PK2 may move to a fourth initial position above the fourth cell CE4. The step of the first picker PK1 moving above the second cell CE2 and the step of the second picker PK2 moving above the fourth cell CE4 may be simultaneously performed.

Next, the first picker PK1 moves to a second corrected position CP2 by using a second corrected coordinate CC2 which is the same as the first corrected coordinate CC1, and picks up the second cell CE2. The second picker PK2 moves to a fourth corrected position by using a fourth correction coordinate which is the same as the third correction coordinate, and picks up the fourth cell CE4. The step of the first picker PK1 moving to the second corrected position CP2 and picking up the second cell CE2 and the step of the second picker PK2 moving to the fourth corrected position and picking up the fourth cell CE4 may be simultaneously performed. The manner in which the first picker PK1 moves to the second corrected position CP2 and picks up the second cell CE2 may be the same as that described in FIGS. 1 to 3D.

The manner in which the second picker PK2 moves to the fourth correcting position and picks up the fourth cell CE4 may be substantially the same as the manner in which the first picker PK1 moves to the second corrected position CP2 and picks up the second cell CE2. That is, the fourth corrected position may be calculated by adding the fourth correction coordinate to the fourth initial position. The second picker PK2 may move from the fourth initial position to the fourth corrected position so as to pick up the fourth cell CE4.

Figure 4D:
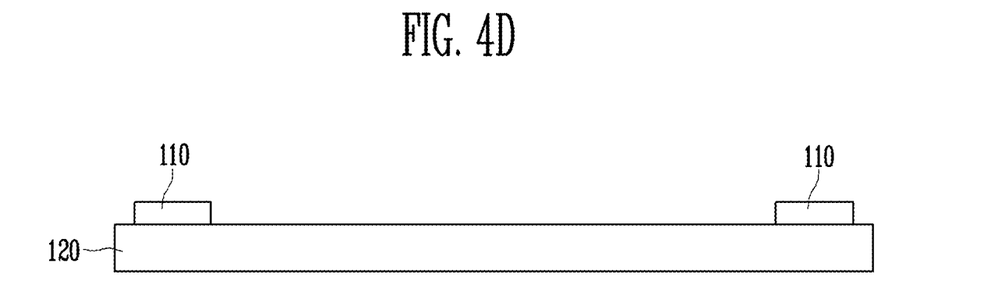

Next, referring to FIG. 4D, the first picker PK1 and the second picker PK2 may simultaneously move the second cell CE2 and the fourth cell CE4 to the next step of the manufacturing process of the display device, respectively.

Next, the first picker PK1 may pick up and move another cell CE that is arranged in the same column as that of the second cell CE2. The second picker PK2 may pick up and move another cell CE that is arranged in the same column as that of the fourth cell CE4. For example, in a case that the second cell CE2 is a cell CE of the plurality of cells CE that is arranged in the first row and the second column, and the fourth cell CE4 is a cell CE of the plurality of cells CE that is arranged in the first row and the fourth column, the first picker PK1 may sequentially pick up a cell CE arranged in the second row and the second column and a cell CE arranged in the third row and the second column, and move them to the next process. The second picker PK2 may sequentially pick up a cell CE arranged in the second row and the fourth column and a cell CE arranged in the third row and the fourth column, and move them to the next process. The first picker PK1 and the second picker PK2 may simultaneously pick up the cells CE that are arranged in the same row, respectively, and move them to the next process. The first picker PK1 and the second picker PK2 may pick up all of the cells CE, which are arranged in the same columns as those of the second cell CE2 and the fourth cell CE4 respectively, by increasing the row number, and move them to the next process. However, the invention is not limited thereto.

According to the method for manufacturing a display device according to the current exemplary embodiment of the invention, the first picker PK1 and the second picker PK2 connected to the same robot arm RA may simultaneously pick up the first cell CE1 and the third cell CE3, respectively. The first picker PK1 may pick up the first cell CE1 by using the first corrected coordinate CC1. The second picker PK2 may pick up the third cell CE3 by using the third corrected coordinate CC3. The first picker PK1 and the second picker PK2 may simultaneously pick up the second cell CE2 and the fourth cell CE4, respectively. The first picker PK1 may pick up the second cell CE2 by using the second corrected coordinate CC2 which is the same as the first corrected coordinate CC1. The second picker PK2 may pick up the fourth cell CE4 by using the fourth correction coordinate which is the same as the third correction coordinate CC3. Accordingly, the time required to calculate the second corrected coordinate CC2 and the fourth correction coordinate may be reduced. The first cell CE1 and the third cell CE3 may be simultaneously picked up and moved, and the second cell CE2 and the fourth cell CE4 may be simultaneously picked up and moved, thereby transferring the plurality of cells CE arranged in the original substrate to the next process more quickly.

Figure 5:
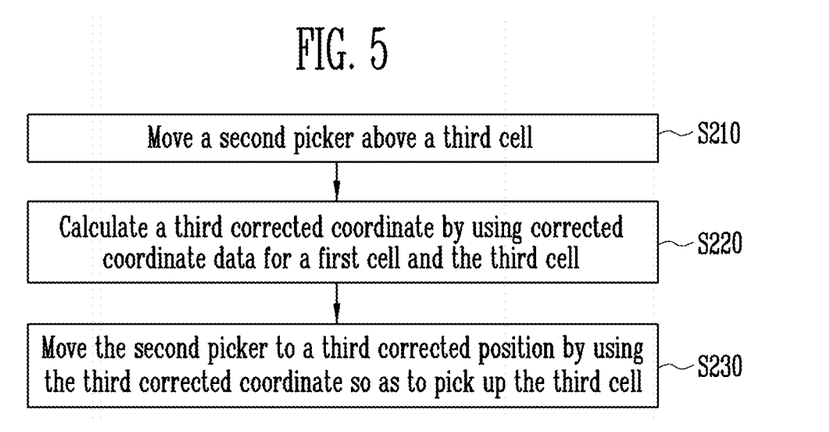
FIG. 5 is a flowchart of another exemplary embodiment of a method for manufacturing a display device according to the invention.
Figure 6A:
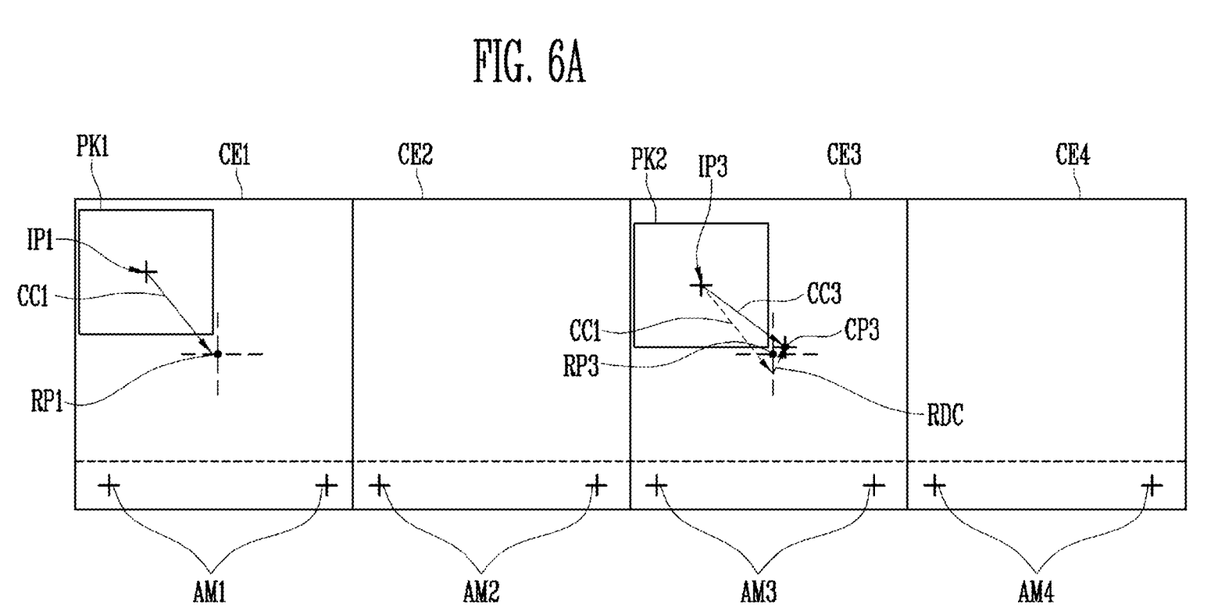
FIGS. 6A and 6B are top plan views of another exemplary embodiment of a method for manufacturing a display device according to the invention.
Figure 6B:
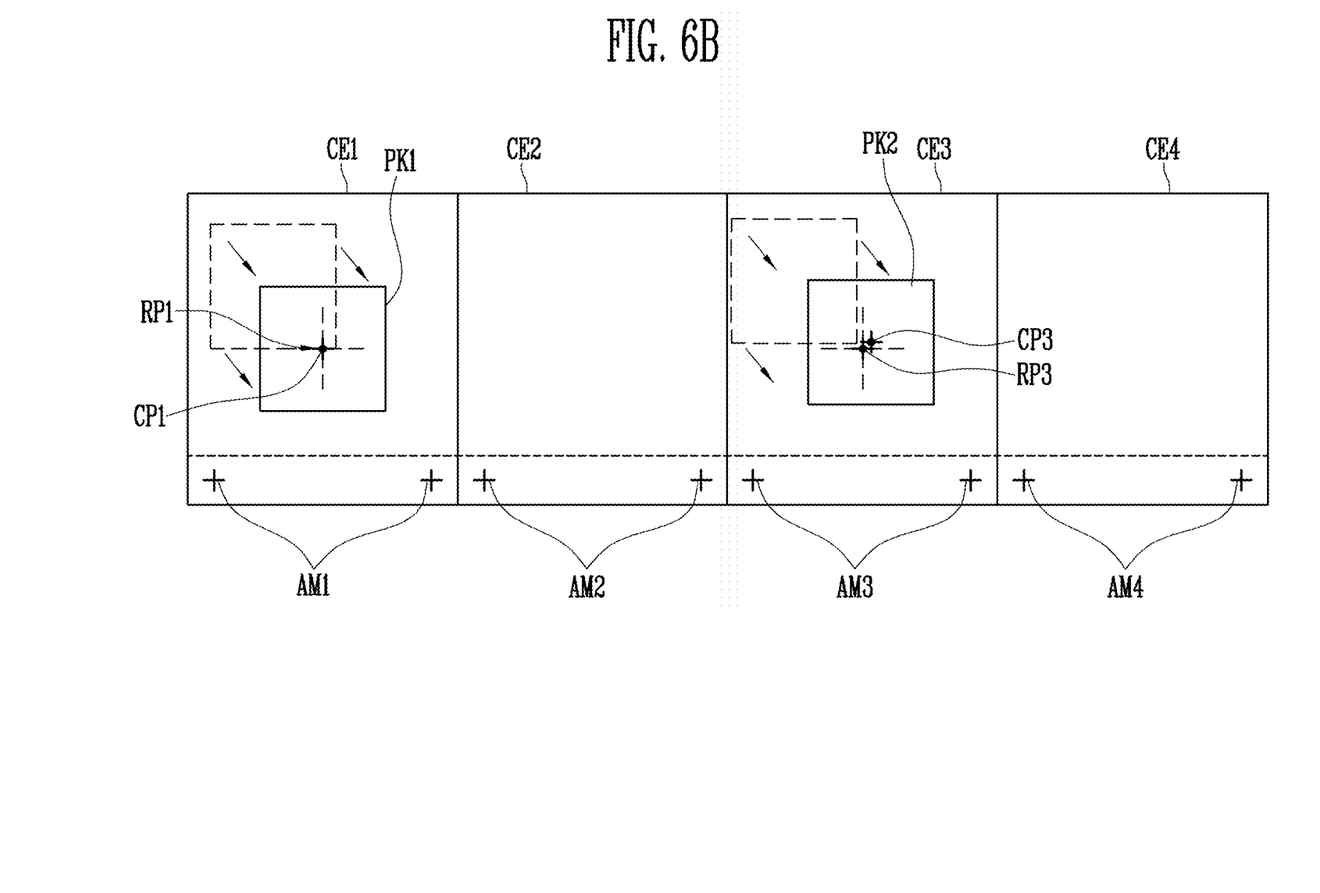

FIG. 5 is a flowchart of another exemplary embodiment of a method for manufacturing a display device according to the invention. FIGS. 6A and 6B are top plan views of another exemplary embodiment of a method for manufacturing a display device according to the invention. A method for manufacturing a display device in FIG. 5 to FIG. 6B is substantially the same as the method for manufacturing a display device in FIGS. 4A to 4D except for the fact that a third corrected coordinate CC3 is differently calculated, so a repeated description will be omitted. In FIGS. 6A and 6B, only first to fourth cells CE1 to CE4 of a plurality of cells CE are shown for convenience of explanation.

Referring to FIGS. 5 and 6A, first, a second picker PK2 moves above a third cell CE3 (S210). The plurality of cells CE includes a first cell CE1, a second cell CE2, a third cell CE3, and a fourth cell CE4 that are sequentially arranged in parallel in the same row. A first picker PK1 may move above the first cell CE1, and the second picker PK2 may move above the third cell CE3. The step of the first picker PK1 moving above the first cell CE1 and the step of the second picker PK2 moving above the third cell CE3 may be simultaneously performed.

Next, a first corrected coordinate CC1 is calculated based on a first initial position IP1 of the first picker PK1 and a reference position RP1 of the first cell CE1. The manner in which the first corrected coordinate CC1 is calculated may be the same as that described in FIGS. 1 to 3D. For example, the first corrected coordinate CC1 may be (x1, y1).

Next, a third corrected coordinate CC3 is calculated by using corrected coordinate data for the first cell CE1 and the third cell CE3 (S220). The corrected coordinate data may include data for the reference position RP1 of the first cell CE1 and the first initial position IP1 of the first picker PK1, and data for a reference position RP3 of the third cell CE3 and a third initial position IP3 of the second picker PK2. The corrected coordinate data may be pre-stored data. Specifically, the corrected coordinate data may include a plurality of first stored corrected coordinates and a plurality of third stored corrected coordinate.

The plurality of first stored corrected coordinates may be stored data for a difference between the first initial position IP1 of the first picker PK1 and the reference position RP1 of the first cell CE1. The first picker PK1 may also have repeated the process of picking up the first cells CE1 of the same column, included in the plurality of the original substrates 110 and transferring them to the next process. While the first picker PK1 is repeatedly performing the process of picking up the first cells CE1 of the plurality of original substrates 110, the data for the difference between the first initial position IP1 and the reference position of the first cell CE1 may be stored as the plurality of first stored corrected coordinates CC1.

The plurality of third stored corrected coordinates CC3 may be stored data for a difference between the third initial position IP3 of the second picker PK2 and the reference position RP3 of the third cell CE3. The second picker PK2 may also have repeated the process of picking up the third cells CE3 of the same column, included in the plurality of the original substrates 110 and transferring them to the next process. While the second picker PK2 is repeatedly performing the process of picking up the third cells CE3 of the plurality of original substrates 110, the data for the difference between the third initial position IP3 and the reference position of the third cell CE3 may be stored as the plurality of third stored corrected coordinates CC3.

Next, a plurality of difference coordinates may be calculated based on the corrected coordinate data. The plurality of difference coordinates may be differences between each of the plurality of first stored corrected coordinates CC1 and each of the plurality of third stored corrected coordinates CC3. The plurality of difference coordinates may be coordinates that are obtained by subtracting each of the plurality of first stored corrected coordinates CC1 from each of the plurality of third stored corrected coordinates CC3.

Next, a representative difference coordinate RDC may be calculated based on the plurality of difference coordinates. The representative difference coordinate RDC is a value that represents the plurality of difference coordinates. The representative difference coordinate RDC may be an average value or a middle value of the plurality of difference coordinates. For example, the representative difference coordinate RDC may be (a, b).

Next, the third corrected coordinate CC3 may be calculated by using the first corrected coordinate CC1 and the representative difference coordinate RDC. The third corrected coordinate CC3 may be a vector that moves the second picker PK2 from the third initial position IP3 to a third corrected position CP3. The third corrected coordinate CC3 may be calculated by adding the representative differ-ence coordinate RDC to the first corrected coordinate CC1. That is, the third corrected coordinate CC3 may be calculated by adding an average value or a middle value of the plurality of difference coordinates to the first corrected coordinate CC1. For example, in a case that the first corrected coordinate CC1 is (x1, y1) and the representative difference coordinate RDC is (a, b), the third corrected coordinate CC3 may be (x1+a, y1+b).

Next, the second picker PK2 moves to the third corrected position CP3 by using the third corrected coordinate CC3 and picks up the third cell CE3 (S230). The third corrected position CP3 may be a final position of the second picker PK2 that is moved by the third corrected coordinate CC3 from the third initial position IP3. The third corrected position CP3 may be calculated by adding the third corrected coordinate CC3 to the third initial position IP3. The second picker PK2 may be moved from the third initial position IP3 to the third corrected position CP3. The second picker PK2 may be lowered to contact the third cell CE3 at the third corrected position CP3, and absorb the third cell to separate it from the original substrate 110 and the other cells CE. The second picker PK2 may move the third cell CE3 to the next step of the manufacturing process of the display device.

The first picker PK1 may move to the first corrected position CP1 by using the first corrected coordinate CC1, and pick up the first cell CE1 to move it to the next process. The step of the first picker PK1 picking up the first cell CE1 and moving it to the next process and the step of the second picker PK2 picking up the third cell CE3 and moving it to the next process may be simultaneously performed.

According to the method for manufacturing a display device according to the current exemplary embodiment of the invention, in a case that the different pickers respectively pick up the different cells CE, the corrected coordinates may be calculated by using the stored corrected coordinate data for each of the different cells CE. For example, in a case that the first picker PK1 picks up the first cell CE1, the first corrected coordinate CC1 may be used. In a case that the second picker PK2 picks up the third cell CE3, the third corrected coordinate CC3 may be calculated by using the corrected coordinate data for the first cell CE1 and the third cell CE3. The third corrected coordinate CC3 may not be calculated by using the third initial position IP3 of the second picker PK2 and the reference position RP3 of the third cell CE3. The corrected coordinate data is a value that is calculated by using the plurality of first stored corrected coordinates and the plurality of third stored corrected coordinate that are pre-stored. Accordingly, the time required to calculate the third corrected coordinate CC3 when picking up the third cell CE3 can be reduced. In addition, the third corrected coordinate CC3 may be calculated by using the corrected coordinate data that are accumulated and stored, thereby further reducing the difference between the third corrected position CP3 and the reference position RP3 of the third cell CE3.

The foregoing description is intended to illustrate and describe the invention. It is to be understood that the foregoing shows only the exemplary embodiments, the invention may be used in various different combinations, modifications, and environments as described above, and changes or modifications may be made within the scope of the inventive concepts disclosed herein, within the scope of equivalents to those described, and/or within the skill or knowledge of those skilled in the art. Accordingly, the foregoing detailed description of the invention is not intended to limit the invention to the disclosed to exemplary

What is claimed is:

1. A method for manufacturing a display device, comprising:
 providing an original substrate on a support member, wherein the original substrate includes a first cell and a second cell adjacent to each other in a row direction or a column direction;
 moving a first picker above the first cell;
 calculating a first corrected coordinate based on an initial position of the first picker above the first cell and a reference position of the first cell;
 moving the first picker to a first corrected position by using the first corrected coordinate such that the first picker picks up the first cell at the first corrected position;
 moving the first picker above the second cell; and
 moving the first picker to a second corrected position by using a second corrected coordinate such that the first picker picks up the second cell at the second corrected position, wherein the second corrected coordinate is the same as the first corrected coordinate.

2. The method of claim 1, wherein
 the calculating the first corrected coordinate includes:
 detecting a position of a first alignment mark on the first cell; and
 detecting the reference position of the first cell based on the position of the first alignment mark.

3. The method of claim 2, wherein
 the first alignment mark is on a pad area in which a plurality of pads of the first cell is disposed.

4. The method of claim 2, wherein
 the calculating the first corrected coordinate further includes:
 calculating the first corrected coordinate by subtracting the initial position of the first picker above the first cell from the reference position of the first cell.

5. The method of claim 1, wherein
 the first corrected position is a sum of the initial position of the first picker above the first cell and the first corrected coordinate, and
 the second corrected position is a sum of an initial position of the first picker moved above the second cell and the second corrected coordinate.

6. The method of claim 5, wherein
 the first corrected position is the same as the reference position of the first cell.

7. The method of claim 1, wherein
 the second cell includes a pad area in which a plurality of pads is disposed and a display area adjacent to the pad area, and
 a difference between a reference position of the second cell and the second corrected position is one-tenth or less of a distance from one side of the pad area adjacent to the display area to the other opposite side of the pad area separated from the display area.

8. The method of claim 1, further including:
 moving a second picker above a third cell adjacent to the second cell, wherein the second picker is different from the first picker;
 calculating a third corrected coordinate based on an initial position of the second picker above the third cell and a reference position of the third cell;
 moving the second picker to a third corrected position by using the third corrected coordinate such that the second picker picks up the third cell at the third corrected position;
 moving the second picker above a fourth cell adjacent to the third cell; and
 moving the second picker to a fourth corrected position by using a fourth corrected coordinate such that the second picker picks up the fourth cell at the fourth corrected position, wherein the fourth corrected coordinate is the same as the third corrected coordinate.

9. The method of claim 8, wherein
 the moving the second picker above the third cell and the moving the first picker above the first cell are simultaneously performed,
 the calculating the first corrected coordinate and the calculating the third corrected coordinate are simultaneously performed,
 the moving the first picker such that the first picker picks up the first cell and the moving the second picker such that the second picker picks up the third cell are simultaneously performed,
 the moving the first picker above the second cell and the moving the second picker above the fourth cell are simultaneously performed, and
 the moving the first picker such that the first picker picks up the second cell and the moving the second picker such that the second picker picks up the fourth cell are simultaneously performed.

10. The method of claim 8, wherein
 the first picker and the second picker are connected to a same robot arm.

11. The method of claim 1, further including:
 moving a second picker above a third cell adjacent to the second cell, wherein the second picker is different from the first picker;
 calculating a third corrected coordinate by using corrected coordinate data for the first cell and the third cell; and
 moving the second picker to a third corrected position by using the third corrected coordinate such that the second picker picks up the third cell at the third corrected position.

12. The method of claim 11, wherein
 the corrected coordinate data includes:
 a plurality of first stored corrected coordinates for a difference between a position of the first picker above the first cell and the reference position of the first cell, and a plurality of third stored corrected coordinates for a difference between a position of the second picker above the third cell and a reference position of the third cell.

13. The method of claim 12, wherein
 the calculating the third corrected coordinate includes:
 calculating a plurality of difference coordinates by subtracting each of the plurality of first stored corrected coordinates from each of the plurality of third stored corrected coordinates; and
 adding a representative difference coordinate and the first corrected coordinate, wherein the representative difference coordinate is an average value or a median value of the plurality of difference coordinates.

14. The method of claim 1, wherein
a pad area of the first cell and a pad area of the second cell are disposed adjacent to each other while having a border between the first cell and the second cell.

15. The method of claim 1, further including:
before the providing the original substrate on the support member,
cutting a plurality of cells included in the original substrate.

16. The method of claim 1, wherein
after picking up the first cell, removing a protection film of the first cell by using a pin, wherein the protection film of the first cell is disposed on a top of a pad area of the first cell; and
after picking up the second cell, removing a protection film of the second cell by using the pin, wherein the protection film of the second cell is disposed on a top of a pad area of the second cell.

* * * * *